United States Patent [19]

Davis

[11] 4,132,907
[45] Jan. 2, 1979

[54] FULL WAVE RECTIFIER CIRCUIT

[75] Inventor: Paul C. Davis, Muhlenberg Township, Berks County, Pa.

[73] Assignee: Bell Telephone Laboratories, Incorporated, Murray Hill, N.J.

[21] Appl. No.: 824,085

[22] Filed: Aug. 12, 1977

[51] Int. Cl.² ........................ H03K 5/00; H04B 1/00
[52] U.S. Cl. .................................. 307/255; 307/261
[58] Field of Search ............... 307/255, 313, 288, 261, 307/262; 328/26

[56] References Cited

U.S. PATENT DOCUMENTS

| | | | |
|---|---|---|---|
| 3,419,787 | 12/1968 | Baehre | 307/255 |
| 3,872,323 | 3/1975 | Frederiksen et al. | 307/313 |
| 3,970,870 | 7/1976 | Horichi | 307/261 |

Primary Examiner—John Zazworsky
Assistant Examiner—B. P. Davis
Attorney, Agent, or Firm—H. W. Lockhart

[57] ABSTRACT

A single-ended input full wave rectifier circuit is disclosed comprising a complementary common emitter amplifier configuration. An input signal comprising complementary pulses, such as a sine wave, causes conduction alternately in the collector circuits of the complementary transistors. One collector output voltage signal is inverted and applied across a load resistor across which the other alternately occurring collector output also is applied. The circuit output taken across the resistor is a series of same-going pulses constituting a full wave rectified version of the circuit input.

6 Claims, 2 Drawing Figures

FULL WAVE RECTIFIER CIRCUIT

BACKGROUND OF THE INVENTION

This invention relates to signal conditioning circuits and, more particularly, to a single-ended input full wave rectifier circuit.

Certain circuit arrangements require that the output signal of one functional stage is transformed from a complementary form to a unidirectional signal typically by full wave rectification. For example, the complementary output signal from an amplifier is rectified for input to another functional circuit stage for timing purposes. Previously, the input to such a full wave rectifier circuit was double-ended so that full wave rectification could be achieved with a suitable noise threshold voltage. In such cases, a relatively complex balanced amplifier circuit is required with commensurate power requirements.

Accordingly, an object of this invention is a full wave rectifier circuit having a single-ended input.

A further object is a full wave rectifier circuit having low power requirements and a suitable noise threshold voltage.

SUMMARY OF THE INVENTION

In accordance with an embodiment of the invention the input terminal of the rectifier circuit is connected to the base electrodes of complementary transistors connected in common emitter configuration with emitter resistors. When a complementary signal, such as a sine wave, its applied at the input, the complementary transistors conduct alternately. The collector output voltage signals of the two transistors then are applied across a load resistor, one of the signals being inverted before application. The output signal across the load resistor is a train of negative-going or positive-going pulses depending on the respective polarities of the transistors, which constitute a full wave rectified version of the input signal.

A feature of the invention is the provision of a noise threshold voltage equal to the emitter-to-base voltage of the complementary transistors which in the silicon integrated circuit form typically used is about 0.7 volts. Condution does not occur in these transistors until the input signal voltage has risen to a value approximately equal to one transistor junction drop, thus effectively providing a threshold level for screening out low level noise.

One advantage of the circuit in accordance with this invention is that the peak voltage of the output signal is independent of the magnitude of the supply voltage.

In a particular embodiment of the invention, the threshold voltage can be predetermined by including an appropriate source of potential in the common emitter resistor circuit.

BRIEF DESCRIPTION OF THE DRAWING

The invention and its other objects and features will be more clearly understood from the following detailed description taken in conjunction with the drawing in which.

DETAILED DESCRIPTION

Figure 1:
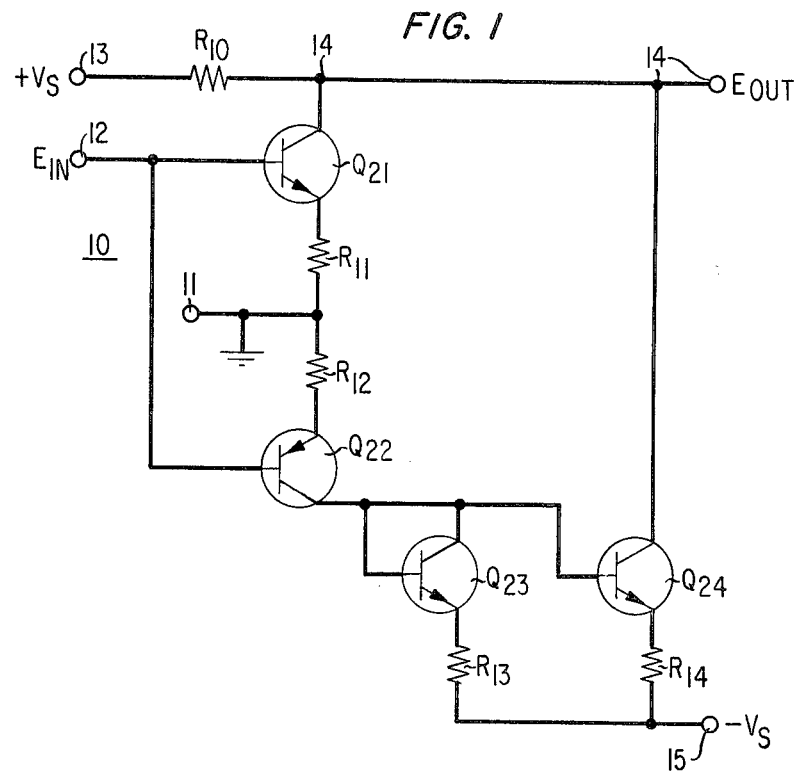
FIG. 1 is a circuit schematic of an embodiment of the invention.

In the full wave rectifier circuit 10 shown on FIG. 1 complementary transistors $Q_{21}$ and $Q_{22}$ are connected in common emitter configuration with resistors $R_{11}$ and $R_{12}$ serially connected between the emitters. A terminal node 11 is connected at a point between resistors $R_{11}$ and $R_{12}$. An input terminal 12 is connected to the base electrodes of both transistors $Q_{21}$ and transistor $Q_{22}$. The collector of $Q_{21}$ is connected to positive supply voltage $(+V_s)$ terminal 13 by way of load resistor $R_{10}$. Node 14 is an output connection.

The collector of the other complementary transistor $Q_{22}$ is connected to the collector-emitter circuit of diode connected transistor 23 whose emitter is connected to negative power supply $(-V_s)$ terminal 15 by way of resistor $R_{13}$. The collector electrode of $Q_{23}$ is also connected to the base electrode of inverter transistor $Q_{24}$ whose emitter likewise is connected to negative power supply terminal 15 by way of a resistor $R_{14}$. The collector of transistor $Q_{24}$ is effectively connected to node 14.

In a specific embodiment according to the circuit of FIG. 1, terminal 13 is at $+3.0$ volts and terminal 15 at $-3.0$ volts. When a signal comprising a series of complementary voltage pulses, typically in sine wave form, is applied at input terminal 12, conduction occurs alternately in transistors $Q_{21}$ and $Q_{22}$. In a specific example, the input to rectifier circuit 10 is approximately 2.8 volts peak to peak as depicted by the sine wave 21 in the graph of FIG. 2, centered around ground. Considering that the emitter-base voltage drop $(V_{BE_{21}})$ of the NPN transistor $Q_{21}$ is about 0.7 volts, this transistor will start to conduct when the input voltage reaches about 0.65 volts. Above this voltage level, $Q_{21}$ acts as an emitter-follower, with the voltage at its emitter duplicating in shape the input voltage. For high beta transistors, approximately the same current flows in the collector as in the emitter. Accordingly, the current in the collector of $Q_{21}$ is substantially the same as its emitter current and the positive portion of the sine wave across $R_{11}$ appears inverted across $R_{10}$. In a similar fashion, when the input since wave is negative, the PNP transistor $Q_{22}$ conducts and the negative half of the sine wave appears across $R_{12}$. The current in $Q_{22}$ is that of a half-wave rectified sine wave and is repeated in NPN transistor $Q_{24}$ by way of the diodeconnected NPN transistor $Q_{23}$. The current of $Q_{24}$ creates a negative-going peak of a sine wave across $R_{10}$ at the same time as the negative half of the input sine wave. Thus, with a negative sine wave peak produced during conduction through $Q_{21}$ by the positive half of the input sine wave, full wave rectification across $R_{10}$ is observed at output terminal 14.

Figure 2:
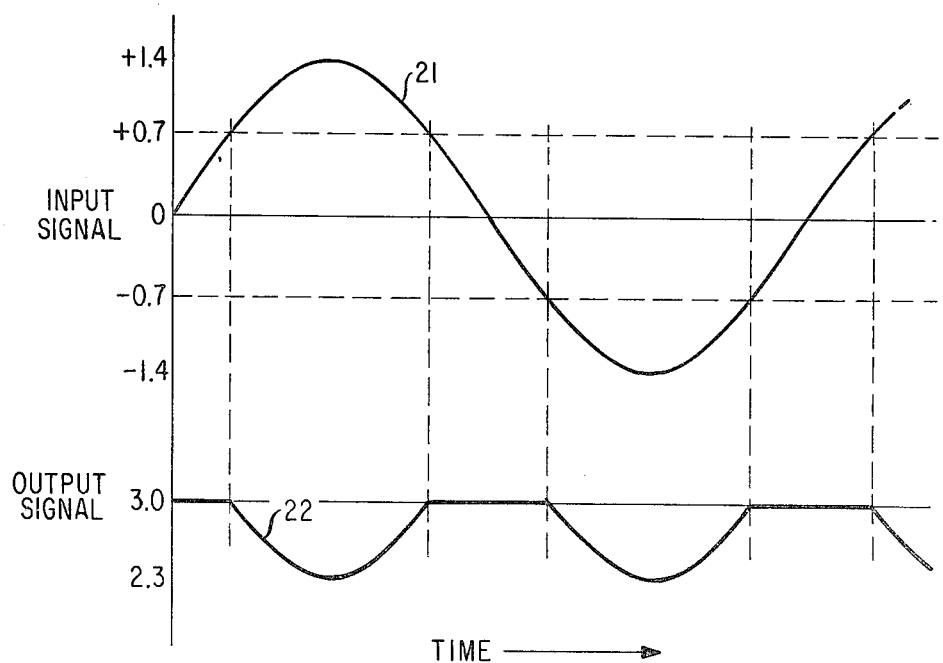
FIG. 2 is a graph showing the input and output signal voltages in the circuit of FIG. 1.

Referring to the graph of FIG. 2, the output wave signal 22 is shown as having a portion at the positive supply voltage, $+3.0$ volts, until the input reaches about 0.65 volts. Then, during the positive half sine wave input above that value, the output rises negatively to a peak of approximately 0.7 volts below the positive supply in this embodiment, about 2.3 volts.

The output signal goes again to the positive supply when the input falls to approximately 0.65 volts and remains there until the negative half of the sine wave input reaches 0.65 volts when conduction begins in the other complementary transistor $Q_{22}$, which produces a similar negative-going output pulse. An advantage of the circuit is that the amplitude of the output signal is independent of the supply voltages and is simply a function of the input signal voltage, the $V_{BE}$ of transistors $Q_{21}$ and $Q_{22}$, and the ratio of $R_{10}$ to $R_{11}$ and $R_{12}$. In this specific embodiment $R_{10}$, $R_{11}$ and $R_{12}$ all have the same value. In effect, the output signal is based on the potential level at terminal 13. Thus, $$E_{out} = +V_s - I_c R_{10} \quad (1)$$

where $I_c$ is the collector current of either $Q_{21}$ or $Q_{22}$.

Satisfactory operation of the circuit in accordance with the invention requires only that the potential at terminal 11 be intermediate the potentials at voltage supply terminals 13 and 15 and that the magnitude of the supply voltage relative to the input signal be such that the complementary transistors are not driven into saturation or breakdown. Thus, although the supply voltages have been referred to as of opposite polarity, plus and minus, it is not necessary that they be so in an absolute sense. Moreover, the circuit may be operated with, in effect, separate potential sources of different magnitudes connected between the emitter resistors and separate grounds, eliminating terminal 11. This relationship holds particularly for integrated circuit transistors which typically have very high output impedance, a characteristic which makes $Q_{21}$ and $Q_{22}$ effectively constant current sources.

The effect of inhibiting condution until the input potential has risen one diode drop ($V_{BE}$) is to provide a useful noise threshold. Noise occurring at the level below about 0.65 volts thus is screened out and is not amplified and transmitted in the output signal as would be the case in the absence of such a threshold.

In a specific embodiment in accordance with the circuit of FIG. 1, the transistors had a beta value of about one hundred. Resistors $R_{10}$, $R_{11}$, and $R_{12}$ were 1000 ohms. Resistors $R_{13}$ and $R_{14}$, characterized as degeneration resistors for compensating for the different gain of the top half (NPN transistor) of the circuit and the bottom half (PNP and NPN transistors), had values of 104 and 100 ohms, respectively. If the transistors are sufficiently closely matched, $R_{13}$ and $R_{14}$ may be omitted.

It is apparent that the full wave rectified output may be generated as positive-going pulses by reversing the polarity of the transistors. The polarity of the supply voltages at terminals 13 and 15 must be adjusted to the polarity of the transistors in the circuit.

What is claimed is:
1. A single-ended input full wave rectifier circuit comprising
 (a) a pair of complementary transistors having emitters connected to form a common emitter circuit,
 (b) an input terminal connected to the base electrodes of said complementary transistors,
 (c) a pair of emitter resistors serially connected in said common emitter circuit,
 (d) a first terminal node between said emitter resistors,
 (e) a first voltage supply terminal,
 (f) a second voltage supply terminal,
 (g) a load resistor connected between the collector electrode of one of said complementary transistors and said first voltage supply terminal,
 (h) an output terminal node between said load resistor and the collector electrode of said one complementary transistor,
 (i) a diode-connected transistor having its collector and base electrodes connected to the collector electrode of said other complementary transistor,
 (j) an inverter transistor having its base electrode connected to the base electrode of said diode-connected transistor and its collector electrode to said output terminal node, and
 (k) said diode-connected and inverter transistors having their emitter electrodes coupled to said second voltage supply terminal.

2. The circuit in accordance that claim 1 in which said one complementary transistor, said diode-connected transistor, and said inverter transistor are of the same conductivity type.

3. The circuit in accordance with claim 1 in which the emitter electrodes of said diode-connected transistor and said inverter transistor are resistively coupled to said second voltage supply terminal.

4. The circuit in accordance with claim 3 in which said resistive coupling comprises a pair of resistors, one between each said emitter electrode and said terminal, said resistors having differing resistance values.

5. The circuit in accordance with claim 1 in which said emitter resistors have the same resistance value.

6. The circuit in accordance with claim 5 in which said load resistor has the same resistance value as said emitter resistors.

* * * * *